US012635291B2

(12) United States Patent
Tchoulfian et al.

(10) Patent No.: US 12,635,291 B2
(45) Date of Patent: May 19, 2026

(54) METHOD FOR LOCAL REMOVAL OF SEMICONDUCTOR WIRES

(71) Applicant: ALEDIA, Echirolles (FR)

(72) Inventors: Pierre Tchoulfian, Grenoble (FR); Pamela Rueda Fonseca, Fontaine (FR); Wei Sin Tan, Grenoble (FR)

(73) Assignee: ALEDIA, Echirolles (FR)

( * ) Notice: Subject to any disclaimer, the term of this patent is extended or adjusted under 35 U.S.C. 154(b) by 648 days.

(21) Appl. No.: 17/621,058

(22) PCT Filed: Jun. 19, 2020

(86) PCT No.: PCT/EP2020/067078
§ 371 (c)(1),
(2) Date: Dec. 20, 2021

(87) PCT Pub. No.: WO2020/254563
PCT Pub. Date: Dec. 24, 2020

(65) Prior Publication Data
US 2022/0336694 A1 Oct. 20, 2022

(30) Foreign Application Priority Data
Jun. 21, 2019 (EP) ..................................... 19315044

(51) Int. Cl.
*H10H 20/01* (2025.01)
*H10H 20/812* (2025.01)

(52) U.S. Cl.
CPC ...... *H10H 20/0137* (2025.01); *H10H 20/812* (2025.01); *H10H 20/0362* (2025.01)

(58) Field of Classification Search
CPC ........................ H10H 20/0137; H01L 33/0075
(Continued)

(56) References Cited

U.S. PATENT DOCUMENTS

2014/0370625 A1 12/2014 Thompson
2014/0370631 A1* 12/2014 Thompson .............. H01L 33/30
438/34
(Continued)

FOREIGN PATENT DOCUMENTS

WO 2017111827 A1 6/2017

OTHER PUBLICATIONS

International Search Report and Written Opinion issued in corresponding International Application No. PCT/EP2020/067078, mailed Sep. 1, 2020, pp. 1-12, European Patent Office, Rijswijk, Netherlands.

*Primary Examiner* — Hsin Yi Hsieh
(74) *Attorney, Agent, or Firm* — HAUPTMAN HAM, LLP

(57) ABSTRACT
A method for local removal of semiconductor wires (SW) including the following steps: —Provide a stack of layers including at least a substrate, a nucleation layer, a growth masking layer, and a layer including SW being grown from the nucleation layer through the growth masking layer, —Encapsulate the SW with an encapsulation layer so as to form a composite layer including SW and encapsulating material, —Pattern a hard mask on the composite layer, so as to expose regions of the composite layer, —Perform anisotropic etching of the composite layer in the exposed regions, the anisotropic etching having a selectivity $S_{semicon}$: $S_{encaps}$ between semiconductor-based material and encapsulating material such as $0.9{:}1{<}S_{semicon}{:}S_{encaps}{<}1.1{:}1$.

12 Claims, 5 Drawing Sheets

400

(58) Field of Classification Search
USPC ............................................................. 438/28
See application file for complete search history.

(56) References Cited

U.S. PATENT DOCUMENTS

| | | | |
|---|---|---|---|
| 2015/0333216 A1 | 11/2015 | Pourquier et al. | |
| 2015/0357987 A1* | 12/2015 | Shealy ................. | H10N 30/852 |
| | | | 333/187 |
| 2016/0064609 A1 | 3/2016 | Cha et al. | |
| 2018/0040764 A1* | 2/2018 | Henley ................. | C30B 25/186 |
| 2018/0198047 A1 | 7/2018 | Danesh et al. | |
| 2018/0287027 A1* | 10/2018 | Chaji ..................... | H01L 33/06 |
| 2021/0320145 A1* | 10/2021 | Chong ................. | H10H 20/857 |

* cited by examiner

501

502

503

504

505

METHOD FOR LOCAL REMOVAL OF SEMICONDUCTOR WIRES

The present application is a U.S. National Phase of International Application Number PCT/EP2020/067078, filed Jun. 19, 2020, which claims priority to European Application No. 19315044.8, filed Jun. 21, 2019.

TECHNICAL FIELD

The invention concerns the field of semiconductor technologies. It may relate more particularly to the manufacture of components based on small semiconductor wires having typically a diameter ranging from few tens nanometers to some micrometers. The invention can be worthily implemented in the manufacturing of wires- or nanowires-based light emitting diode (W-LED or NW-LED).

BACKGROUND

In the field of semiconductor technologies, three-dimensional arrays of semiconductor wires (SW) are considered as promising alternatives to two-dimensional planar semiconductor structures.

In particular, such 3D arrays may improve the overall efficiency of optoelectronics devices such as LED, which require good crystal quality for light emission, as well as good optical properties for light extraction.

For manufacturing cost issues, a plurality of 3D arrays of SW has to be integrated on a wafer.

A first solution consists in growing locally the SW arrays on each chip or LED of the wafer, by masking areas where SW are unwanted.

Such a solution often leads to inhomogeneity and/or discontinuities in SW arrays, typically due to growth perturbations at the edges of masked areas. This eventually affects the SW-based devices.

A second solution consists in growing SW all over the wafer, then removing SW from areas where SW are unwanted. Such a solution is called Wiresea growth concept.

The document EP 2936571 B1 discloses methods for locally removing SW from a Wiresea growth, as illustrated in FIGS. 1A-1E.

The Wiresea growth can typically be achieved using a stack 10 comprising a substrate 11, a two-dimensional nucleation layer 12 and a growth masking layer 13, also referred as SAG layer for "Selective Area Growth" layer.

SW 21 are grown from the nucleation layer 12 through apertures in the SAG layer 13, forming a single SW array 20 regularly distributed on the stack 10 all over the wafer (FIG. 1A).

In order to remove SW 21 from areas where SW are unwanted, a protective photoresist layer 30a is first deposited on the single SW array 20 (FIG. 1B).

A patterning of the protective photoresist layer 30a is then performed by conventional lithography, to leave areas free of protective layer 30a (FIG. 1C).

Then, SW 21 are removed from these areas free of protective layer 30a using either a wet etching process, a dry etching process, or a mechanical action to break the SW.

Wet and dry etching process result in partial etching 132 of the underlying layer, typically the SAG layer 13, from the exposed surface 131 (FIG. 1D).

Ultimately, such etching process can also damage the nucleation layer 12.

Mechanical action to break the SW is difficult to control and generally results in a partial removal of SW (FIG. 1E).

In any case, a rough surface unsuitable for reproducible manufacturing conditions is obtained in the areas where SW are etched or broken.

The present invention is intended to overcome at least partially some of the aforementioned drawbacks.

More precisely, an object of the present invention is a method for local removal of semiconductor wires which allows the effective removal of SW while maintaining the integrity of the underlying layer.

Another object of the present invention is a method for local removal of semiconductor wires which reduces the roughness of areas where SW are removed.

The other objects, characteristics and advantages of the present invention will appear in the examination of the following description and accompanying drawings. It is to be understood that other benefits may be incorporated.

SUMMARY

To achieve these objectives, the invention provides a method for local removal of semiconductor wires comprising the following steps:

Provide a stack of layers comprising at least a substrate, a growth masking layer, and a layer comprising semiconductor wires in a semiconductor-based material, Encapsulate the semiconductor wires with an encapsulation layer in an encapsulating material, so as to form a composite layer comprising semiconductor wires and encapsulating material, Pattern a hard mask on the composite layer, so as to expose regions of the composite layer, Perform anisotropic etching of the composite layer in the exposed regions, the anisotropic etching having a selectivity $S_{semicon}:S_{encaps}$ between semiconductor-based material and encapsulating material such as $0.9:1 < S_{semicon}:S_{encaps} < 1.1:1$, Stop the anisotropic etching of the composite layer so as to leave a residual composite layer having a thickness between 0 nm and 500 nm, preferably between 0 nm and 200 nm, and more preferably between 0 nm and 100 nm.

This method is advantageously designed to achieve a single etching step of the exposed regions of the composite layer with a selectivity $S_{semicon}:S_{encaps}$ around 1:1.

In this way, the SW are etched at about the same etching rate as the encapsulation layer in the exposed regions.

The top surface of the underlying growth masking layer is thus always protected during the etching step. It prevents any damages of the underlying layer.

Moreover, the stop of the etching step can be controlled precisely, so as to obtain a thin residual composite layer. The SW are effectively removed in the exposed regions, while the surface roughness of the exposed regions after etching is drastically decreased compared to prior art methods.

In addition, such a method involving a single etching step of the exposed regions of the composite layer allows an effective removal of the SW regardless of their height.

The effective removal of the SW is thus not depending on the height of the SW to be removed.

The SW to be removed often have height variations and an overetch step is then required in prior art process. Such an overetch step contributes to partial etching of the underlying layer.

According to the invention, forming a composite layer prior to a single etching step of said composite layer prevents from an overetch of the SW, while ensuring effective removal of the SW.

Further removal of the encapsulating material may be performed, so as to free the SW in the regions protected by the hard mask. In the exposed regions, removing the encapsulating material in the residual composite layer may result in regularly distributed small SW residues of controlled height.

Such well-defined SW residues are suitable for further manufacturing steps such as forming a dielectric collar at the base of the SW, unlike the residues obtained randomly by other prior art methods.

The method according to the invention is therefore simpler than known methods for local removal of SW. It is also more efficient to remove SW while protecting underlying layers.

It also makes it possible to adjust the height of the SW residues more precisely, so as to obtain a surface roughness suitable for reproducible manufacturing conditions, especially for SW-based LED manufacturing.

Another object of the present invention is a method for manufacturing of semiconductor wires-based light emitting diode (SW-LED) which comprises the method claimed above.

It is noteworthy that such a SW-LED manufacturing method benefits from the subsequent classical technological steps required to obtain a LED.

In particular, the method for local removal of semiconductor wires is fully compatible with such subsequent classical technological steps.

The overall SW-LED manufacturing method is then cost effective.

BRIEF DESCRIPTION OF THE DRAWINGS

Embodiments of the invention are illustrated by the following accompanying drawings in which.

Figure 1A:
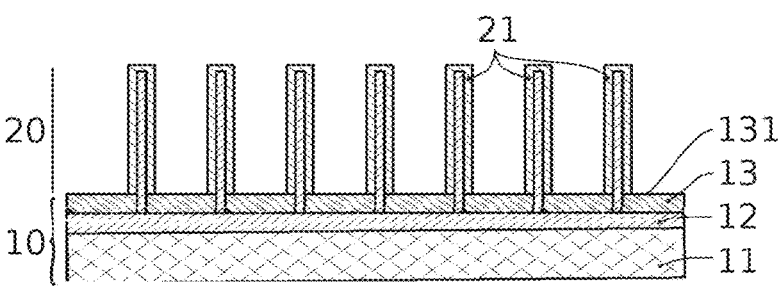
FIGS. 1A to 1E show steps of a SW local removal method according to the prior art.
Figure 1B:
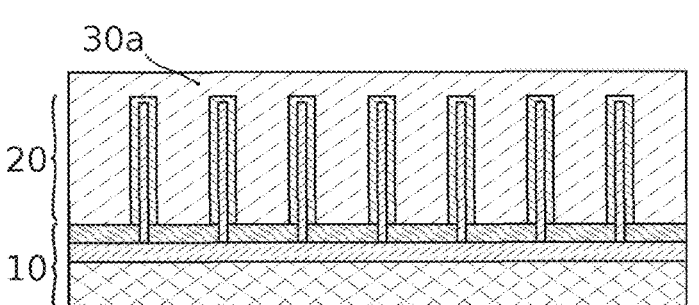
Figure 1C:
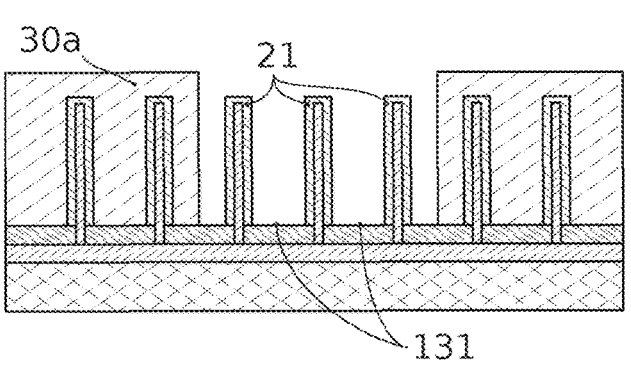
Figure 1D:
Figure 1D:
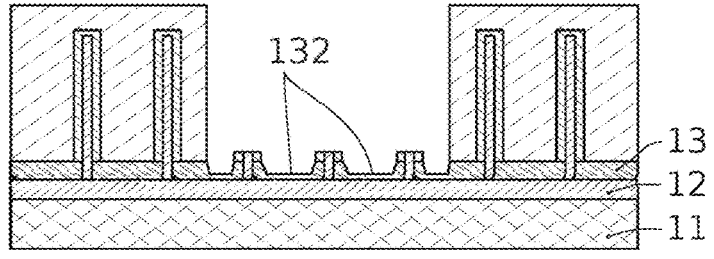
Figure 1E:
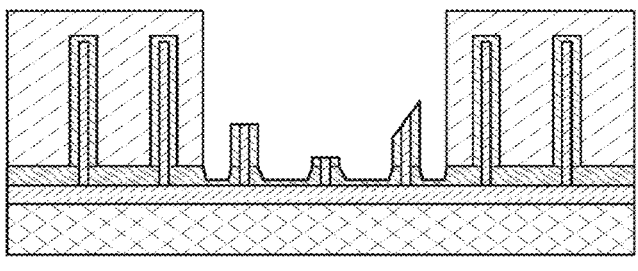

The drawings are given as examples and are not restrictive of the invention. They are schematic representations of principle intended to facilitate the understanding of the invention and are not necessarily on the scale of practical applications. In particular, the height, thicknesses and dimensions of the SW and of the different layers and regions of the LEDs shown are not representative of reality.

DETAILED DESCRIPTION

Before beginning a detailed review of embodiments of the invention, are set forth below optional features that can optionally be used in combination or alternatively:

According to one embodiment, the thickness of the encapsulating layer is greater than or equal to the height of a highest semiconductor wire of the semiconductor wires.

According to one embodiment, the composite layer is bulk.

According to one embodiment, the stack of layers comprises a nucleation layer in between the substrate and the growth masking layer, said semiconductor wires being at least partially grown from the nucleation layer through the growth masking layer.

According to one embodiment, the semiconductor-based material is a GaN-based material.

According to one embodiment, the encapsulating material is chosen among SiO2, SiN, SiON, or a flowable oxide.

According to one embodiment, the anisotropic etching is performed using a plasma comprising chlorinated species, preferably an argon/chlorine-based plasma.

According to one embodiment, the semiconductor wires have an average height between 1 μm and 15 μm and an average diameter between 0.1 μm and 2 μm.

According to one embodiment, the encapsulation layer is formed by spin coating.

According to one embodiment, the encapsulation layer is deposited by a deposition technique among plasma-enhanced chemical vapor deposition (PECVD), sub-atmospheric chemical vapor deposition (SACVD), low pressure chemical vapor deposition (LPCVD).

According to one embodiment, the composite layer is planarized before patterning the hard mask.

According to one embodiment, the hard mask and the encapsulating material are removed after stopping the anisotropic etching of the composite layer, so as to leave regions without semiconductor wires in place of the residual composite layer, and regions with semiconductor wires in place of the composite layer.

In the present invention, the local SW removal method is in particular dedicated to the manufacture of SW-based optoelectronic devices, in particular LEDs. A LED typically includes p- and n-doped regions in relation with an active region where the light is emitted.

However it is to be understood that this method can be used for the manufacture of other microelectronic devices, for example in the field of transistors or MEMS.

Unless explicitly stated, it is specified that, in the context of this invention, the relative arrangement of a third layer between a first layer and a second layer does not necessarily mean that the layers are in direct contact with each other, but means that the third layer is either in direct contact with the first and second layers or separated from each other by at least one other layer or at least one other element.

In this invention, types of doping are indicated. The corresponding dopings are not exhaustive examples. The invention covers all modes of implementation in which doping is reversed. Thus, if an embodiment mentions for a first layer of a SW a p-doping and for a second layer of the SW a n-doping, then this description implicitly describes, at least, the opposite example in which the first layer presents an n-doping and the second layer presents a p-doping.

A p-doping includes all doping by positive charge carriers regardless of the concentration of dopants. Thus, a p-doping can be defined as a p, p+ or p++ doping. Similarly, an n-doping includes all doping by negative charge carriers regardless of the concentration of dopants. Thus, an n-doping can be defined as an n, n+ or n++ doping.

The following abbreviations for a material M may be used:

i-M refers to the intrinsic or not intentionally doped material M, according to the terminology usually used in the field of microelectronics for the prefix i-.

n-M refers to the n-doped material M according to the terminology usually used in the field of microelectronics for prefix n-.

p-M refers to the p-doped material M according to the terminology usually used in the field of microelectronics for prefix p-.

A device, a substrate, a layer, a SW, "based" on a material M, means a device, a substrate, a layer, a SW comprising this material M only or this material M and possibly other materials, for example alloying elements, impurities or doping elements. For example, a gallium nitride (GaN) SW may include gallium nitride (GaN or i-GaN) and/or doped gallium nitride (p-GaN, n-GaN) and/or gallium-indium nitride (InGaN) and/or gallium-aluminium nitride (AlGaN).

In the present application, depth, height and thickness are taken perpendicularly to a basal plane of the substrate. Preferably we will talk about thickness for a layer, height for a SW, and depth for an etching for example.

The terms "substantially", "approximately", "about" mean "to the nearest 10%" or, in the case of an angular orientation, "to the nearest 10°". Thus, a direction substantially normal to a plane means a direction with an angle of $90\pm10°$ to the plane.

In order to determine whether a SW-based device has been manufactured from the method of this invention, scanning electron microscopy (SEM) or transmission electron microscopy (TEM) analysis may be performed.

In particular, a cross-sectional observation at a contact pad may determine whether there are SW residues having about the same height at the base of said contact pad, and whether these SW residues originate from SW previously grown through a SAG layer.

Another characteristic result of the method according to the invention is a preserved SAG layer surface.

The combination of a SAG layer having no or few damages with SW residues having about the same height may be serious indications of the use of this method.

A first embodiment of the SW local removal method according to the invention will now be described with reference to FIGS. 2A to 2E.

SW 21 are preferably grown on a planar stack 10 of layers 12, 13 which lie on a substrate 11.

The substrate 11 may be made of silicon, GaN or sapphire.

Figures 2A, 2B, 2C, 2D, 2E:
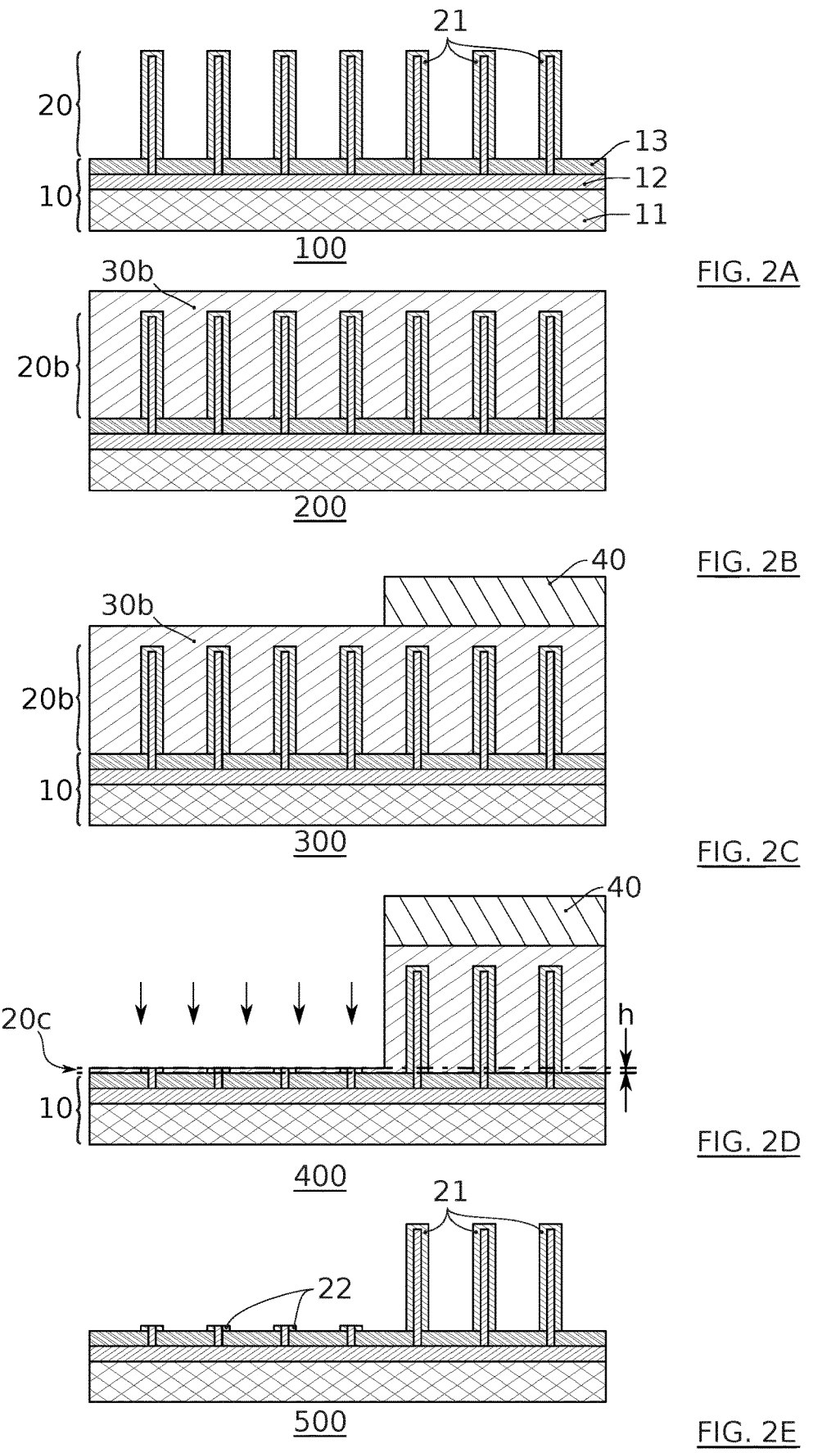
FIGS. 2A to 2E show steps of a SW local removal method according to one embodiment of the present invention.

Each layer 12, 13 of the stack 10 extend in a basal plane and the stack 10 is formed in a direction normal to the basal plane (FIG. 2A).

Typically, the stack 10 may include a two-dimensional (2D) nucleation layer 12 overlaid by a growth masking layer hereafter referred as Selective Area Growth (SAG) layer 13.

Both 2D nucleation layer 12 and SAG layer 13 are preferably directly in contact with each other.

The 2D nucleation layer 12 may be made of (AI)(In)(Ga) N, or of tantalum, of tantalum nitride, of niobium, of niobium nitride, of titanium, of titanium nitride, of hafnium, of hafnium nitride, of boron, of boron nitride, of magnesium, of magnesium nitride, of tungsten, of tungsten nitride, or of a combination thereof.

The 2D nucleation layer 12 may have a thickness in the range 5 nm to 50 nm, typically 25 nm.

The SAG layer 13 may be made of SiN, SiO2, SiON, HfO2, HfN, Sc2O3, ScN, Mg2O3 or other dielectric materials.

The SAG layer 13 may have a thickness in the range 20 nm to 200 nm, typically 100 nm.

Holes or apertures are regularly distributed, for example in a pitch of 5 μm, but can be any pitch sizes between 100 nm to 100 μm throughout the SAG layer 13 so as to expose the underlying 2D nucleation layer 12.

These holes have a diameter ranging from some tens of nanometers to some micrometers, for example about 0.5 μm.

These holes are designed to assist a local growth of SW 21 from the nucleation layer 12.

SW 21 can be grown by different growth techniques depending on the desired internal structure of the SW 21. The internal structure may be a longitudinal structure or a radial structure.

For example, SW 21 having the longitudinal structure can be grown by preferably by Molecular Beam Epitaxy (MBE) or by metal organic chemical vapour deposition (MOCVD) or remote plasma chemical vapour deposition (RP-CVD) or HVPE (Halide Vapor Phase Epitaxy or Hydride Vapour Phase Epitaxy).

For GaN-based SW 21, such a longitudinal structure may include p-GaN and n-GaN regions arranged according to the direction normal to the basal plane, with InGaN quantum wells in between.

SW 21 having the radial structure, also referred as core-shell structure, can be grown by Metal-Organic Chemical Vapour Deposition (MOCVD), or by Metal-Organic Vapour Phase Epitaxy (MOVPE), or by Hydride Vapour Phase Epitaxy (HVPE), or by Molecular Beam Epitaxy (MBE).

For GaN-based SW 21, such a radial structure may include p-GaN, InGaN and n-GaN regions concentrically arranged around an axis normal to the basal plane.

Figure 4:
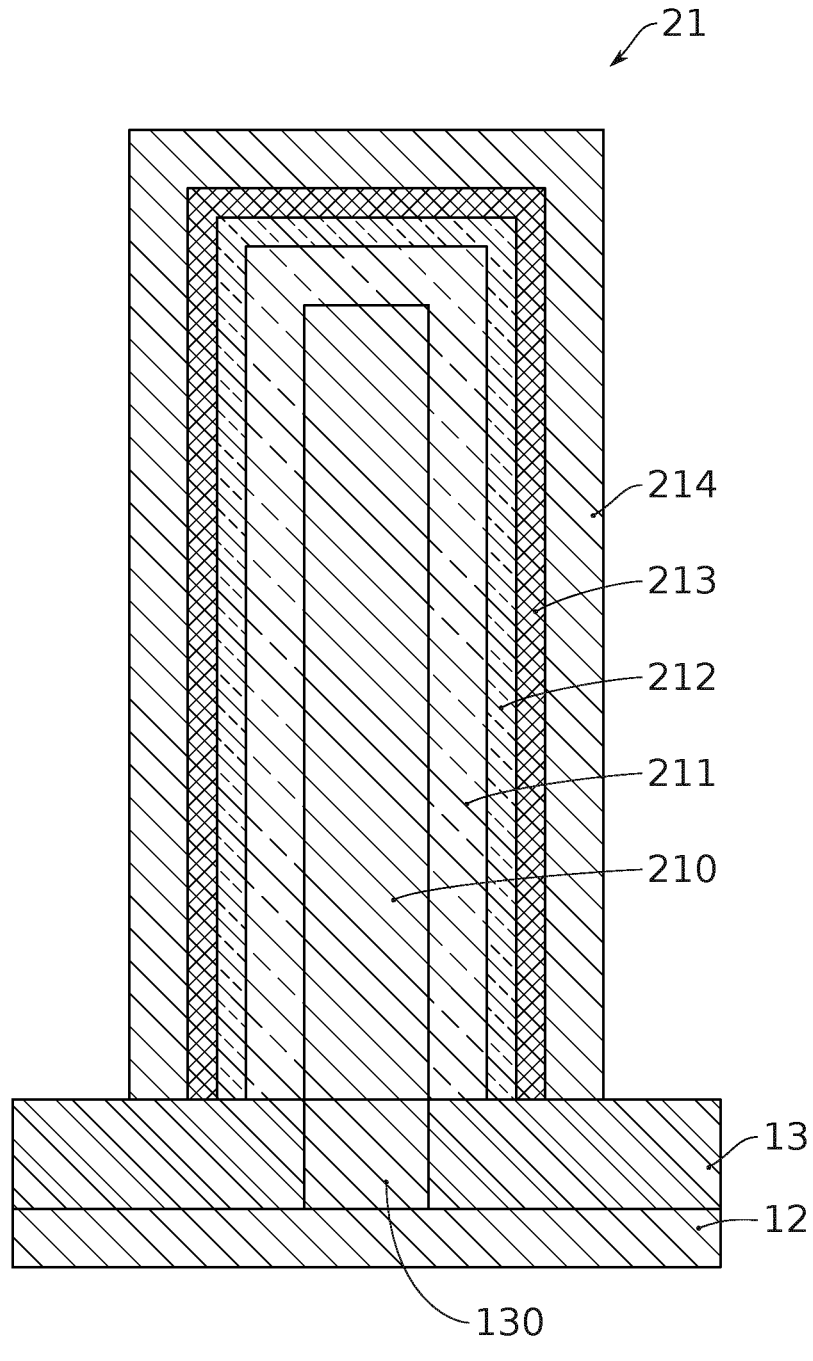
FIG. 4 is a close-up of a SW according to an embodiment of the present invention.

FIG. 4 shows a particular arrangement for such a radial structure.

SW 21 can include the following sequence of regions or layers, from the inside to the outside of the SW in a radial direction:

A core 210 having a diameter in the range 200 nm to 1.2 μm, typically 700 nm. The core 210 is preferably made of GaN.

A shell 211 having a thickness in the range 50 nm to 500 nm, typically 250 nm. The shell 211 is preferably made of n-GaN.

An active region 212 having a thickness in the range 20 nm to 250 nm, typically 40 nm. The active region 212 is preferably made of InGaN. The active region 212 preferably includes i-InGaN quantum wells (QW) alternating with i-(Al)GaN quantum barriers (QB). QW may have a thickness in the range 1 nm to 15 nm and QB may have a thickness in the range 3 nm to 20 nm.

An Electron Blocking Layer (EBL) 213 having a thickness in the range 10 nm to 100 nm, typically 30 nm. The EBL 213 is preferably made of AlGaN.

An outside region 214 having a thickness in the range 50 nm to 500 nm, typically 250 nm. The outside region 214 is preferably made of p-GaN.

The core 210 of the SW 21 is first grown, for instance by MOCVD, through the holes 130 of the SAG layer 13. Then, layers 211, 212, 213, 214 may be successively grown on one another so as to form a radial structure, preferably as illustrated in FIG. 4.

For convenience, SW 21 are illustrated in the following with a simple core-shell structure, regardless of the effective number of layers in the radial structure. It has also to be understood that this representation may also correspond to a longitudinal structure, if compatible.

After growth of the SW 21, a single SW array 20 regularly distributed on the stack 10 all over the wafer is advantageously obtained (FIG. 2A).

Providing 100 such a single SW array 20 is prior to the following steps according to the method of the invention.

In order to locally remove SW 21, the single SW array 20 is first encapsulated 200 with an encapsulating material, as illustrated in FIG. 2B.

The encapsulating material may be made of SiO2, SiON, SiN, BCB (Benzocyclobutene), poly methyl methacrylate (PMMA), or any form of epoxy, resin or dielectric materials.

It can be deposited by Plasma-Enhanced Chemical Vapor Deposition (PECVD) so as to form an encapsulation layer 30*b* coating the SW 21. The encapsulating material may also be deposited by sub-atmospheric chemical vapor deposition (SACVD) or low pressure chemical vapor deposition (LPCVD).

Alternatively, the encapsulation layer 30*b* may be formed by spin-coating, for instance from a Flowable Oxide (FOx) or a spin-on glass, followed by annealing. These techniques are well known.

The thickness of the encapsulation layer 30*b* is preferably greater than or equal to the height of the semiconductor wires 21. In the case where SW 21 have different height to each other, the thickness of the encapsulation layer 30*b* is preferably greater than or equal to the highest SW 21.

A composite layer 20*b* comprising both encapsulating material and semiconductor material is thus obtained. The composite layer 20*b* is preferably bulk, with no or few porosity within.

In particular, it is possible to form such a bulk composite layer 20*b* with the above-mentioned techniques. A composite layer 20*b* having a low surface roughness may be obtained.

Alternatively or in addition, the top surface of the composite layer 20*b* may be planarized, for instance by Chemical Mechanical Polishing (CMP), in order to get a flat top surface of the composite layer 20*b*. In this way, even if some SW 21 protrudes from the surface of the composite layer 20*b* after spin coating for instance, a low surface roughness is obtained. The repeatability of the method is improved.

A low surface roughness, preferably a peak-to-valley roughness lower than 100 nm, advantageously prevents over-etching during the subsequent etching of the composite layer 20*b*.

Once a composite layer 20*b* having a low surface roughness is obtained (FIG. 2B), a hard mask 40 is patterned 300 on the composite layer 20*b*, so as to protect regions of the composite layer 20*b* where SW 21 have to be kept and so as to expose regions of the composite layer 20*b* where SW 21 have to be removed (FIG. 2C).

The regions of the composite layer 20*b* where SW 21 have to be removed may typically correspond to bonding pad regions and/or to chip trimming regions of LED.

The regions of the composite layer 20*b* where SW 21 have to be kept may typically correspond to active regions of LED.

As illustrated in FIG. 2D, a single etching step of the exposed regions of the composite layer 20*b* is then performed 400.

Such a single etching step is preferably anisotropic and has a selectivity $S_{semicon}:S_{encaps}$ between semiconductor-based material and encapsulating material such as $0.9:1 < S_{semicon}:S_{encaps} < 1.1:1$. The selectivity $S_{semicon}:S_{encaps}$ is preferably about 1:1 (one by one).

The single etching step preferably consists in a dry etching performed by plasma, for instance by Reactive-Ion Etching (RIE). A Capacitively Coupled Plasma (CCP) reactor or an Inductively Coupled Plasma (ICP) reactor may be used.

In particular for GaN-based SW 21 encapsulated in SiO2, a selectivity GaN:SiO2 about 1:1 may be obtained using an argon/chlorine-based plasma.

A selectivity GaN:SiO2 about 1:1 may also be obtained using low pressure Cl2/BCl3 inductively coupled plasmas, as described in the document "S. Zhuo et al., Dry etching characteristics of GaN using Cl2/BCl3 inductively coupled plasmas, Applied Surface Science, 905-910 (2010)".

It is known that other etching solutions may also be used to achieve a GaN:SiO2 selectivity about 1:1.

The anisotropic etching of the composite layer 20*b* is preferably performed so as to leave a thin residual composite layer 20*c* having a thickness h lower than 500 nm, and preferably lower than 200 nm (FIG. 2D).

This thin residual composite layer 20*c* prevents over-etching. The underlying SAG layer 13 is thus protected.

The encapsulating material can then be removed 500, for instance by wet etching, in order to free the SW 21 in the protected regions of the composite layer 20*b*, as illustrated in FIG. 2E.

For SiO2 or FOx encapsulating material, this can be achieved using typically a wet chemistry solution based on hydrofluoric acid HF. A good selectivity etchant against the SAG layer is necessary, otherwise areas where SW have been etched will need to be patterned or masked to prevent parasitic SAG etching.

SW residues 22 coming from the residual composite layer 20*c* may persist after such a wet etching. These SW residues 22 are substantially composed of the same layers as the SW 21 at their base.

These SW residues 22 all have about the same height h with h<500 nm, and preferably h<200 nm. Their diameters are close to the diameters of the SW 21 at their base.

For industrial manufacturing issues, in case of SW residues 22 it is important to have such a controlled height h in a reproducible way. Subsequent manufacturing steps can further be adjusted in accordance with the SW residues 22. The reproducibility of the overall manufacturing process is improved.

As an example, FIGS. 3A to 3E describe further steps typically involved in manufacturing SW-based LED.

Figure 3A:
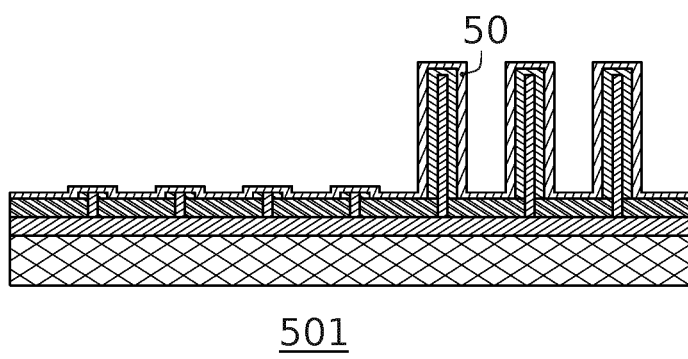
FIGS. 3A to 3E show steps which can be further performed with benefits from a SW local removal method according to one embodiment of the present invention.

From the structure obtained in FIG. 2E according to the local SW removal method of the invention, a conformal dielectric layer 50 may be deposited 501 (FIG. 3A).

Figure 3B:
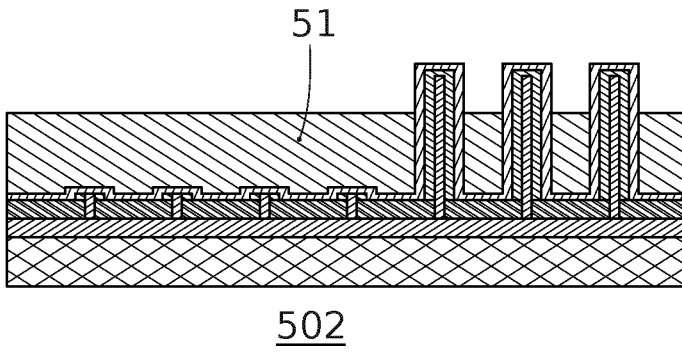

A masking layer 51 is then deposited 502, for instance by spin-coating, in order to protect a lower part of the SW 21 while exposing an upper part of the SW 21 (FIG. 3B). The thickness of the masking layer 51 is chosen in such a way that the upper part of the SW 21 is at least 500 nm high.

Figure 3C:
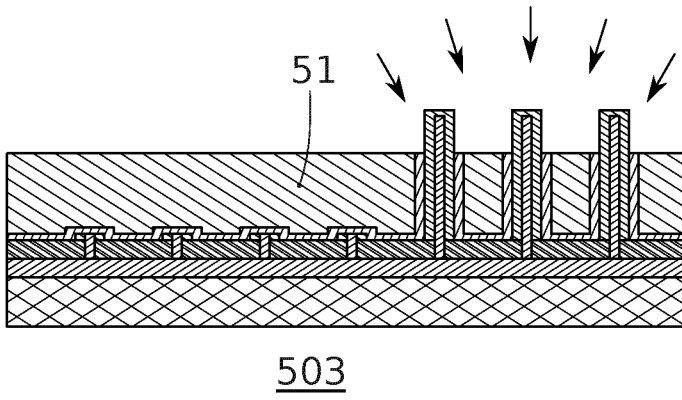

An isotropic etching is then performed 503 in order to remove the exposed part of the dielectric layer 50 surrounding the upper part of the SW 21 (FIG. 3C).

Figure 3D:
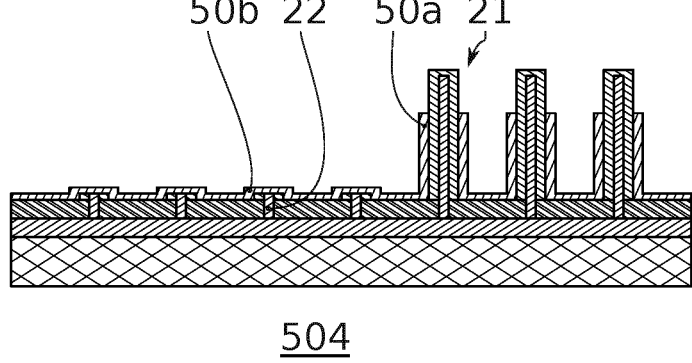

The masking layer 51 is then removed 504 (FIG. 3D). A dielectric collar 50*a* surrounding the lower part of the SW 21 is thus obtained, as well as a dielectric layer 50*b* covering the SW residues 22.

Figure 3E:
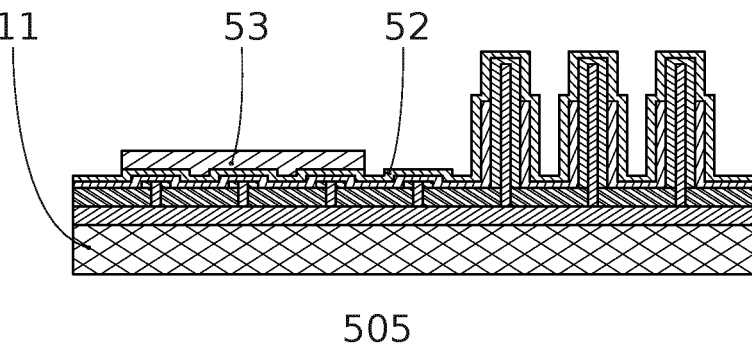

Transparent Conductive Oxide (TCO) layer 52 and metallic pad contact 53 may then be deposited 505, so as to form a SW-based LED (FIG. 3E).

The TCO and pad contact are thus isolated from the SW residues 22 and from the substrate 11, while connecting the exposed upper part of the SW 21.

The invention is not limited to the embodiments previously described and extends to all the embodiments covered by the claims.

The invention claimed is:

1. A method for local removal of semiconductor wires, the method comprising:

providing a stack of layers, said stack of layers comprising at least a substrate, a growth masking layer, and a layer comprising the semiconductor wires in a semiconductor-based material, encapsulating the semiconductor wires with an encapsulation layer in an encapsulating material, so as to form a composite layer comprising the semiconductor wires and the encapsulating material, planarizing the composite layer by Chemical Mechanical Polishing (CMP), patterning a hard mask on the composite layer, so as to obtain regions of the composite layer not covered by the hard mask, performing anisotropic etching of the composite layer in the regions not covered by the hard mask, the anisotropic etching having a selectivity $S_{semicon}:S_{encaps}$ between the semiconductor-based material and the encapsulating material such as $0.9:1 < S_{semicon}:S_{encaps} < 1.1:1$, and stopping the anisotropic etching of the composite layer so as to leave a residual composite layer in the regions not covered by the hard mask, wherein the anisotropic etching is performed using a plasma comprising chlorinated species, and the plasma is an argon/chlorine-based plasma.

2. The method according to claim 1, wherein a thickness of the encapsulation layer is greater than or equal to a height of a highest semiconductor wire of the semiconductor wires.

3. The method according to claim 1, wherein the composite layer has a surface roughness less than 100 nm.

4. The method according to claim 1, wherein the stack of layers comprises a nucleation layer in between the substrate and the growth masking layer, said semiconductor wires being at least partially grown from the nucleation layer through the growth masking layer.

5. The method according to claim 1, wherein the semiconductor-based material is a GaN-based material.

6. The method according to claim 1, wherein the encapsulating material is chosen among: SiO2, SiN, SiON or a flowable oxide.

7. The method according to claim 1, wherein the semiconductor wires have an average height between 1 μm and 15 μm and a diameter between 0.1 μm and 2 μm.

8. The method according to claim 1, wherein the encapsulation layer is formed by spin coating.

9. The method according to claim 1, wherein the encapsulation layer is deposited by a deposition technique among plasma-enhanced chemical vapor deposition (PECVD), sub-atmospheric chemical vapor deposition (SACVD), low pressure chemical vapor deposition (LPCVD).

10. The method according to claim 1, wherein the hard mask and the encapsulating material are removed after stopping the anisotropic etching of the composite layer, so as to leave regions corresponding to the residual composite layer without semiconductor wires, and regions corresponding to the composite layer with semiconductor wires.

11. A method for manufacturing of a semiconductor wires-based light emitting diode, comprising: local removing semiconductor wires by:

providing a stack of layers, said stack of layers comprising at least a substrate, a growth masking layer, and a layer comprising the semiconductor wires in a semiconductor-based material, encapsulating the semiconductor wires with an encapsulation layer in an encapsulating material, so as to form a composite layer comprising the semiconductor wires and the encapsulating material, planarizing the composite layer by Chemical Mechanical Polishing (CMP), patterning a hard mask on the composite layer, so as to obtain regions of the composite layer not covered by the hard mask, performing anisotropic etching of the composite layer in the regions not covered by the hard mask, the anisotropic etching having a selectivity $S_{semicon}:S_{encaps}$ between the semiconductor-based material and the encapsulating material such as $0.9:1 < S_{semicon}:S_{encaps} < 1.1:1$, and stopping the anisotropic etching of the composite layer so as to leave a residual composite layer in the regions not covered by the hard mask, wherein the anisotropic etching is performed using a plasma comprising chlorinated species, and the plasma is an argon/chlorine-based plasma.

12. The method according to claim 1, wherein a thickness of the residual composite layer is greater than 0 nm and less than 500 nm.

* * * * *